(12) United States Patent
Satani et al.

(10) Patent No.: US 6,600,684 B2
(45) Date of Patent: Jul. 29, 2003

(54) SEMICONDUCTOR STORAGE DEVICE

(75) Inventors: Norihiko Satani, Miyazaki (JP); Masakuni Kawagoe, Miyazaki (JP)

(73) Assignee: Oki Electric Industry Co., Ltd. (JP)

( * ) Notice: Subject to any disclaimer, the term of this patent is extended or adjusted under 35 U.S.C. 154(b) by 0 days.

(21) Appl. No.: 09/987,753

(22) Filed: Nov. 15, 2001

(65) Prior Publication Data

US 2003/0012068 A1 Jan. 16, 2003

(30) Foreign Application Priority Data

Jul. 12, 2001 (JP) ........................................ 2001-212231

(51) Int. Cl.[7] .............................................. G11C 29/00
(52) U.S. Cl. .................... 365/201; 365/210; 365/189.09
(58) Field of Search ................................ 365/201, 210, 365/189.09

(56) References Cited

U.S. PATENT DOCUMENTS

| | | | | |
|---|---|---|---|---|
| 5,339,273 A | * | 8/1994 | Taguchi | 365/201 |
| 5,719,815 A | * | 2/1998 | Takahashi et al. | 365/222 |
| 5,982,682 A | * | 11/1999 | Nevill et al. | 365/201 |
| 6,169,695 B1 | * | 1/2001 | Duesman | 365/201 |

FOREIGN PATENT DOCUMENTS

JP   7-201199   8/1995

* cited by examiner

*Primary Examiner*—Richard Elms
*Assistant Examiner*—Nam Nguyen

(57) ABSTRACT

Switching is provided such that the bit lines between a sense amp and the memory cells connected to the sense amp are put into a non-conducting state during normal operation, and are put into a conducting state during characteristic tests. A control circuit is provided which outputs control signals to control the conducting state of this switching. The control circuit has a signal generation unit and a control signal switching unit. The signal generation unit generates driving signals and the inverted signals of these driving signals in order to drive the control circuit using applied voltages from outside. The control signal switching unit includes a plurality of transmission gates, and outputs control signals according to memory cell select signals and the inverted signals of same, based on the combination of conducting and non-conducting states of the transmission gates, which depend on the supply of driving signals and inverted driving signals.

7 Claims, 8 Drawing Sheets

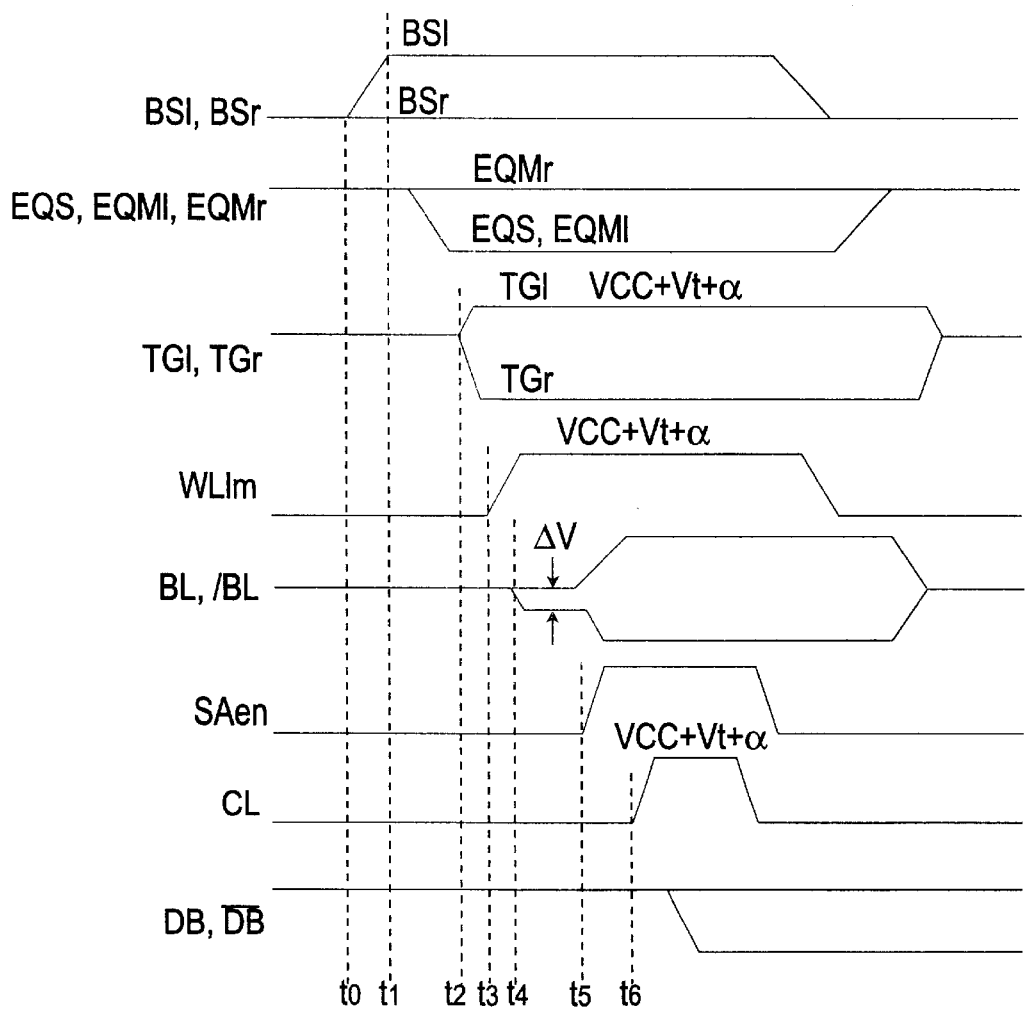

US 6,600,684 B2

SEMICONDUCTOR STORAGE DEVICE

BACKGROUND OF THE INVENTION

1. Field of the Invention

This invention relates to a semiconductor storage device to achieve simplification of the screening of defective memory cells in probing tests.

2. Description of Related Art

FIG. 7 is a figure showing in summary an example of the configuration of the principal parts of dynamic RAM (hereafter called "DRAM") comprising a sense amp.

The DRAM shown in FIG. 7 comprises a first and second memory cell array (MCBLKl and MCBLKr), and one sense amp 10.

The two memory cell arrays (MCBLKl and MCBLKr) and the sense amp 10 are connected by a bit line pair comprising two bit lines, indicated by BL and /BL.

In these DRAM memory cell arrays MCBLKl and MCBLKr, numerous word lines intersect with this bit line pair (BL and /BL), and memory cells are connected to these intersections.

In FIG. 7, four word lines (WLlm, WLln, WLrm and WLrn), and a first through a fourth memory cell (12, 14, 16 and 18), are shown.

The sense amp 10 is connected to a sense amp driving line SAen to activate the sense amp 10.

A first and second transistor T1 and T2 are provided between the sense amp 10 and the memory cell array MCBLKl. The gate electrodes of these transistors (T1 and T2) are connected to a transfer gate control line TGl. The channel of the transistor T1 is provided on the bit line BL, and the channel of the transistor T2 is provided on the bit line /BL.

Between the sense amp 10 and the memory cell array MCBLKr are provided a third and fourth transistor T3 and T4. The gate electrodes of these transistors (T3 and T4) are connected to a transfer gate control line TGr. The channel of the transistor T3 is provided on the bit line BL, and the channel of the transistor T4 is provided on the bit line /BL.

First to third bit line equalizer circuits (20, 22 and 24), including equalizer lines (EQMl, EQMr and EQS), are connected to BL and /BL.

Between BL or /BL, and the data buses DB or /DB, are provided a fifth and sixth transistor (T5 and T6) which control these connections.

A column select line CL is connected to the gates of these transistors (T5 and T6).

FIG. 8 is a figure showing an example of the configuration of a conventional semiconductor storage device, and is used to explain signal outputs of signal lines the names of which appear in FIG. 7 (TGl, TGr, EQMl, EQMr, EQS).

The signal output circuit shown in FIG. 8 comprises first, second and third NOT gates (26, 28 and 30), series-connected in order, which take the output voltage level from the memory cell select signal line BSl which selects the memory cell as the output voltage level of the equalizer line EQMl; fourth, fifth and sixth NOT gates (32, 34 and 36), series-connected in order, which take the output voltage level from the memory cell select signal line BSr as the output voltage level of the equalizer line EQMr; a circuit in which are series-connected a first NAND gate 38 and a seventh NOT gate 40, in this order, which takes the output voltage level from the memory cell select signal lines (BSl and BSr), after passing through the first and fourth NOT gates 26 and 32 respectively, as the output voltage level of the equalizer line EQS; a first transfer gate control line control unit 44, comprising seventh through 14th transistors (T7, T8, T9, T10, T11, T12, T13, T14) and an eighth NOT gate 42, which takes the output voltage level from the memory cell select signal line BSl as the output voltage level of the transfer gate control line TGl; and, a second transfer gate control line control unit 48, comprising 15th through 22nd transistors (T15, T16, T17, T18, T19, T20, T21, T22) and a ninth NOT gate 46, which takes the output voltage level from the memory cell select signal line BSr as the output voltage level of the transfer gate control line TGr.

In FIG. 8, 50 and 52 are first and second high-potential voltage output units, which output high voltages (Vcc+Vt+α (where Vcc is the power supply voltage, Vt is a threshold voltage, and α>0)), constantly input from outside, to the first and second transfer gate control line control units.

The first transfer gate control line control unit 44 is connected to the connection point of the NOT gates 26 and 28, to the output points of the NOT gates 28 and 34, and to the output point of the first high-voltage output unit 50. The second transfer gate control line control unit 48 is connected to the connection point of the NOT gates 32 and 34, to the output points of the NOT gates 34 and 28, and to the output point of the second high-voltage output unit 52.

Next, the operation during data readout (zero (0) readout) of the DRAM shown in FIG. 7 and FIG. 8 is explained.

FIG. 9 is an operating waveform diagram employed in this explanation, indicating the operating waveforms during zero (0) readout from memory cells.

At time t0 (initial state), both of the above two DRAM memory cell arrays (MCBLKl and MCBLKr) are in the unselected state, and the signal levels of the memory cell select signal lines (BSl and BSr), which select the memory cell for data readout, are both at the low logical level, that is, the "low" state (this state corresponds to a binary "0", and hereafter is denoted "L").

From FIG. 8, the levels of the equalizer signals output at this time by the equalizer lines (EQMl, EQMr and EQS) are at the logical high level, that is, the "high" state (this state corresponds to a binary "1", and is hereafter denoted "H"), and each of the bit lines BL and /BL is precharged to the (½)Vcc level (where Vcc is the power supply voltage).

At time t1, the signal level of the memory cell select signal line BSl which controls the selected memory cell array MCBLKl changes from the "L" state to the "H" state. This is accompanied by a change in the level of the equalizer signal output from the equalizer lines (EQMl and EQS) from the "H" state to the "L" state.

Hence equalization of the bit lines BL and /BL of the selected memory cell array MCBLKl stops, and so each of the bit lines enters a floating state while being maintained at a potential of (½)Vcc.

Also at this time, the level of the equalization signal output from the equalizer line (EQMr) goes to the "H" state, and equalization of the bit lines BL and /BL of the unselected memory cell array MCBLKr is maintained.

Then, at time t2, the output voltage from the transfer gate control line TGl between the selected memory cell array MCBLKl and the sense amp 10 becomes Vcc+Vt+α (where Vt is a threshold value, and α>0).

Further, the transfer gate control line TGr between the unselected memory cell array MCBLKr and the sense amp 10 goes to GND level (for a reason explained below).

Hence the gates of the transistors (T1 and T2) are turned on, and the line between the selected memory cell array MCBLKl and the sense amp 10 becomes conducting. On the other hand, the gates of the transistors T3 and T4 are turned off, and the line between the unselected memory cell array MCBLKr and the sense amp 10 is in the non-conducting state.

Next, at time t3, one of the word lines (here, assumed to be WLlm) is selected, and the output voltage from this word line (WLlm) goes to the level Vcc+Vt+α (where Vt is a threshold value, and α>0) (word line voltage increase).

At time t4, the information written to the memory cell (here, shown by 12) selected by the selected word line (WLlm) is output as a potential difference ΔV to the bit line (here BL). At this time, the voltage of the bit line /BL is at the (½)Vcc level.

Then, at time t5, the sense amp enable signal output from the sense amp driving line SAen changes from the "L" state to the "H" state, and in response the sense amp 10 is activated.

Through the sensitivity amplification action of the activated sense amp 10, the potential of the bit line BL is pulled up to Vcc, and the potential of the bit line /BL is lowered to GND level.

Next, at time t6 the level of the column select line CL changes from the "L" to the "H" state, and in response the potential difference of the bit lines BL and /BL is generated on the data buses DB and /DB, so that the bit line information (until now, the information zero (0)) is read on the data buses.

According to reference (1) (ULSI DRAM Gijutsu, Science Forum, Takao Nakano and Yoichi Akasaka, editors, pp. 37–38), in reading data (either "1" or "0") written to a memory cell, the potential change ΔV in the bit line at the time of reading from a "one transistor plus one capacitor"-type memory cell is expressed by the following equations. At this time, the precharge level of the bit lines (BL and /BL) is in both cases (½)Vcc (where Vcc is the power supply voltage).

$$\Delta V(1) = (Vcc/2)/(1+Cb/Cs) \quad (1)$$

$$\Delta V(0) = (Vcc/2)/(1+Cb/Cs) \quad (2)$$

Here Cs is the memory cell capacitance, and Cb is the stray capacitance of the bit line. From the above equations (1) and (2), ΔV depends on the ratio Cb/Cs of Cb and Cs.

In configuring the DRAM, it is preferable that Cb/Cs be made as small as possible, to ensure an adequate signal voltage difference ΔV for detection by the sense amp, in order to prevent malfunction of the sense amp.

This is because, in a configuration in which ΔV is small, the sense amp sensitivity may be inadequate; or, even for a voltage difference ΔV that can be sensed by the sense amp, there is a greater possibility that normal sensitivity amplification action may not occur, or that the sense amp may otherwise malfunction.

Hence in the above-described explanation of DRAM operation, the setting of the voltage level from the transfer gate control line TGr to GND level is in order to reduce Cb as much as possible and ensure an adequate ΔV, by employing a configuration in which the line capacitance (Cb) of the bit lines BL and /BL of the memory cell array MCBLKr, which is unselected, is not considered.

In the past, in manufacturing such semiconductor storage devices (DRAM), electrical characteristic tests (probe tests and similar) to confirm operation as a semiconductor device are performed after completion of wafer processes.

In these probe tests, a voltage is applied to the pad (electrode) portions on the semiconductor wafer, the electrical characteristics of the tested circuit are inspected, and the inspection results are used to judge the quality of the device.

These probe tests are used to screen memory cells, and redundancy replacement and other processing of defective memory cells extracted in this process is performed.

In performing screening, rewriting of the data contents written to memory cells, and various tests to judge the quality when writing data differing from that of neighboring memory cells, are performed.

This is performed because normally, a defective memory cell among memory cells positioned in extremely close proximity may erroneously pass a test, without its defective nature being discriminated, due to the influence of peripheral memory cells (through coupling or similar).

Hence various tests must be performed in order to execute more rigorous screening, and so there are concerns that such tests will require increased time and costs.

Hence a technical method for resolving the above problems has been sought.

SUMMARY OF THE INVENTION

One object of this invention is to provide a semiconductor storage device for which screening can be performed using probe tests which are simpler than in the prior art.

In order to achieve this object, the semiconductor storage device of this invention has the following configuration features. That is, the semiconductor device comprises a bit line pair, comprising a first and second bit line each connected to a plurality of memory cells, and a sense amp and control circuit connected by this bit line pair.

Through control signals output from this control circuit, the semiconductor storage circuit causes the first and second bit lines between the sense amp and the memory cells connected to the sense amp to be in the non-conducting state during normal operation, and causes these bit lines to be in the conducting state during characteristic tests.

By this means, it is possible to appropriately switch the connection state of the bit lines between the sense amp and the memory cells to which the sense amp is connected, during probe tests or other electrical characteristic tests and during normal operation.

BRIEF DESCRIPTION OF THE DRAWINGS

The foregoing and other objects, features and advantages of the present invention will be better understood from the following description taken in connection with the accompanying drawings in which.

DESCRIPTION OF THE PREFERRED EMBODIMENTS

Figure 1:
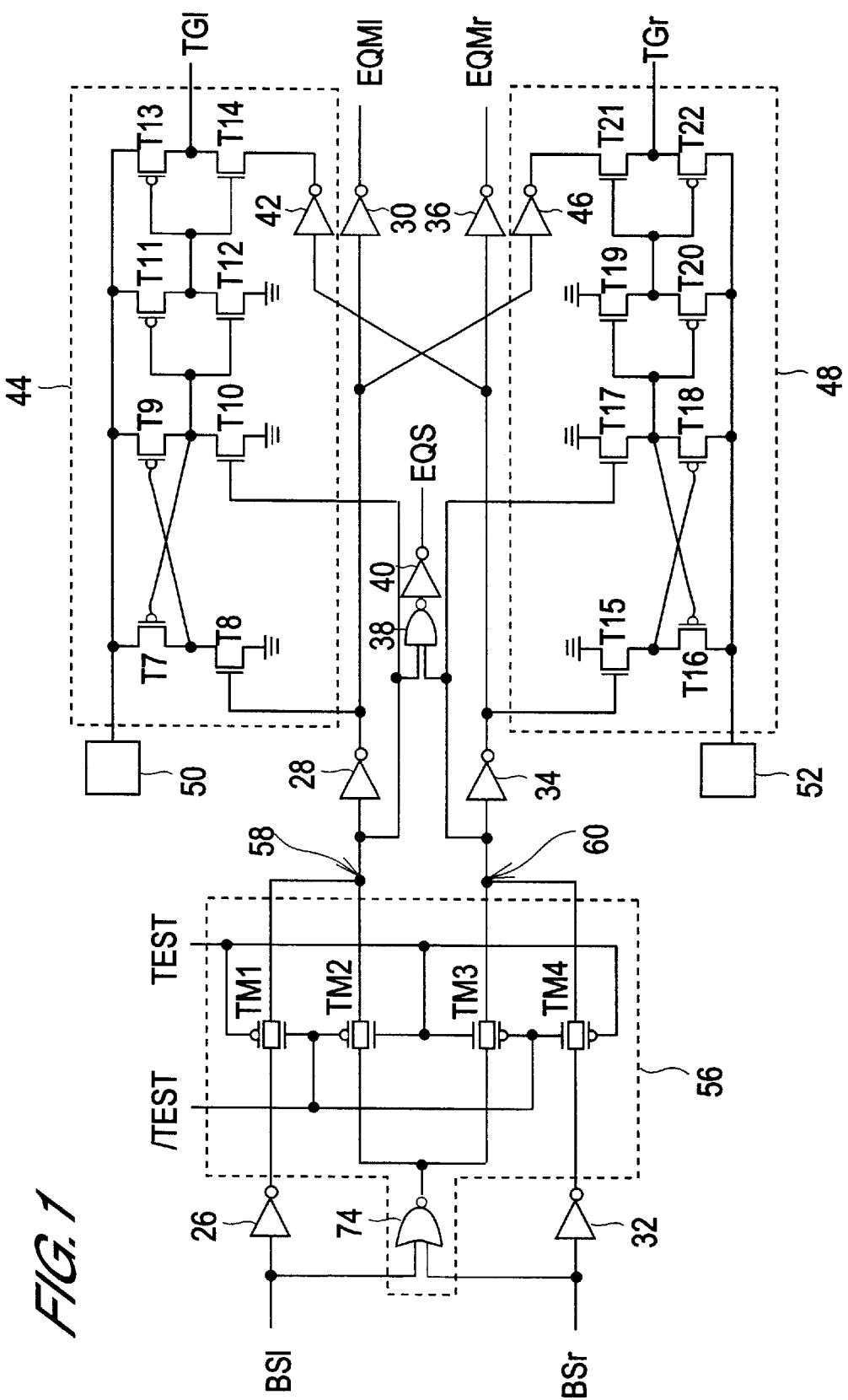
FIG. 1 is a schematic diagram of the principal parts of a semiconductor storage device of this invention.

Below, embodiments of this invention are explained, referring to the drawings.

The embodiments explained below are no more than examples of preferred configurations of this invention, and hence these preferred configuration examples do not in any way limit the scope of this invention.

First Embodiment

The semiconductor storage device of this invention comprises a bit line pair, comprising a first and a second bit line each connected to a plurality of memory cells, a sense amp connected between the first and second bit lines, and a control circuit which outputs control signals to these first and second bit lines.

Figure 7:
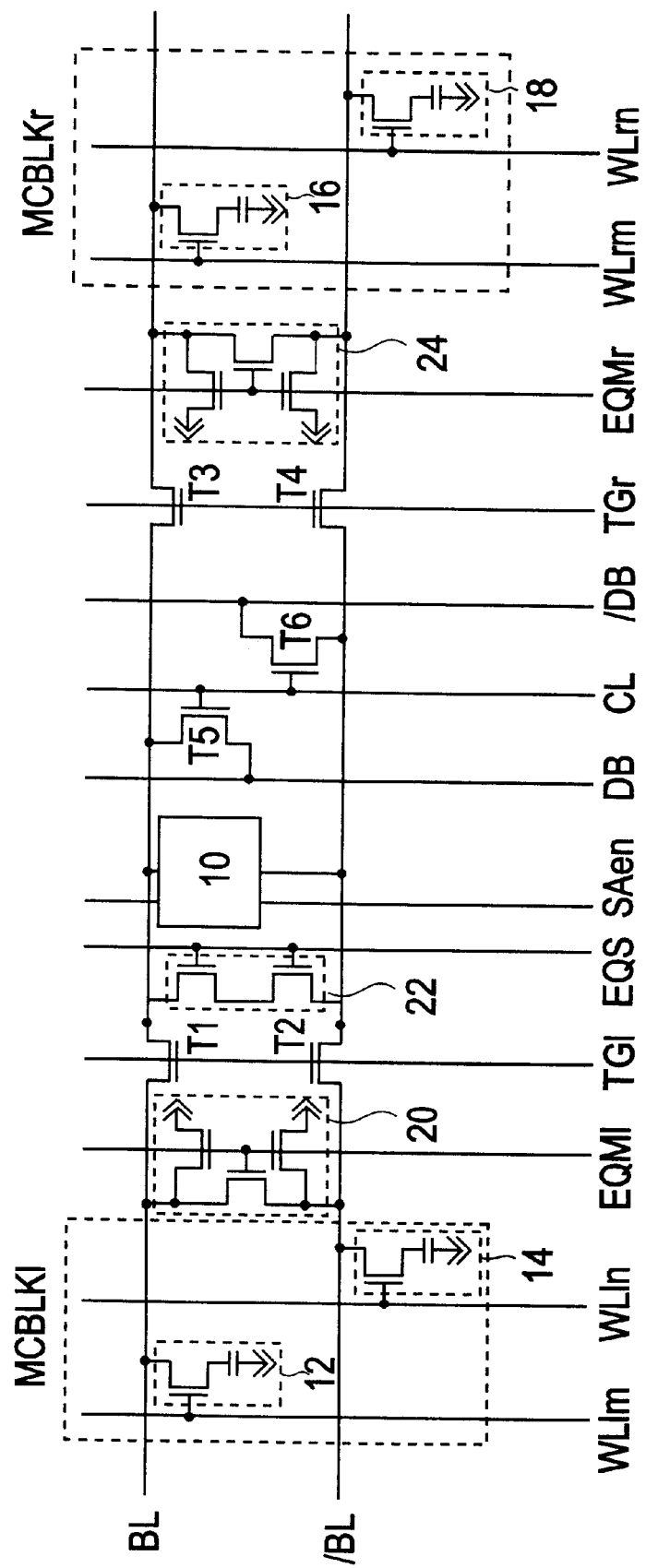
FIG. 7 is a schematic diagram of the principal parts of a semiconductor storage device of this invention.

In this embodiment, except for the control circuit, the example of configuration of a semiconductor storage device already explained with reference to FIG. 7 is used in explanations.

As shown in FIG. 7, the DRAM in this embodiment comprises a first and a second memory cell array (MCBLKl and MCBLKr), and one sense amp 10.

The two memory cell arrays (MCBLKl and MCBLKr) and the sense amp 10 are connected by a bit line pair, comprising two bit lines, represented by the bit line BL as the first bit line and the bit line /BL as the second bit line.

In the memory cell arrays MCBLKl and MCBLKr of this DRAM, numerous word lines intersect with BL and /BL, and memory cells are connected at each of these intersections.

In FIG. 7, four word lines (WLlm, WLln, WLrm and WLrn), and a first through a fourth memory cell (12, 14, 16 and 18), for a total of four, are shown.

The sense amp 10 is connected to a sense amp driving line SAen to activate the sense amp 10.

In the section between the sense amp 10 and the memory cell array MCBLKl, a first and a second transistor T1 and T2 are provided as part of the bit lines BL and /BL respectively. In other words, the main current path between source electrode and drain electrode, that is, the channel, of the transistor T1 is provided in the bit line BL. And, the main current path between source electrode and drain electrode, that is, the channel, of the transistor T2 is provided in the bit line /BL. The transfer gate control line TGl is connected to the gate electrodes of these transistors (T1 and T2).

Also, third and fourth transistors T3 and T4 are provided in the section between the sense amp 10 and the memory cell array MCBLKr, as part of the bit lines BL and /BL respectively. That is, the main current path between source electrode and drain electrode, that is, the channel, of the transistor T3 is provided in the bit line BL. And, the main current path between source electrode and drain electrode, that is, the channel, of the transistor T4 is provided in the bit line /BL. The transfer gate control line TGr is connected to the gate electrodes of these transistors (T3 and T4).

In this embodiment, the gates of these third and fourth transistors T3 and T4 are gate electrodes for use as switching means.

First through third bit line equalizer circuits (20, 22 and 24), including equalizer lines (EQMl, EQMr and EQS) are connected to BL and /BL.

Also, fifth and sixth transistors (T5 and T6) are provided between either BL or /BL, and the data bus DB or /DB, connecting the same.

A column select line CL is connected to the gate electrodes of these transistors (T5 and T6).

This invention does not have as a distinctive feature the configuration of the above-described memory cells (12, 14, 16, 18), sense amp 10, equalizer circuits (20, 22, 24), switching means (T1, T2, T3, T4) and similar, but rather has as a distinctive feature a control circuit to appropriately switch the connection states of a first bit line and a second bit line (BL, /BL) between the sense amp 10 and the memory cells (12, 14, 16, 18).

In this invention, the internal configurations of the first and second transfer gate control line control units 44 and 48, and of the first and second high-voltage output units 50 and 52, may be the same as in the prior art, and do not themselves have any distinctive features.

The above-described control circuit of a semiconductor storage device in this embodiment comprises a configuration in which control signals are output which put the bit line section between the sense amp and the memory cells connected to this sense amp into a non-conducting state during normal operation, and into a conducting state during characteristic tests. In this embodiment, this bit line section is the bit line BL as a first bit line, and the bit line /BL as a second bit line. This is explained in detail below.

FIG. 1 is a figure provided to explain the signal outputs of signal lines (TGl, TGr, EQMl, EQMr, and EQS) to which the same names are assigned as in FIG. 7, and shows in summary an example of a configuration of the control signal switching unit, which is a principal part of a preferred control circuit applied to this invention.

Figure 2:
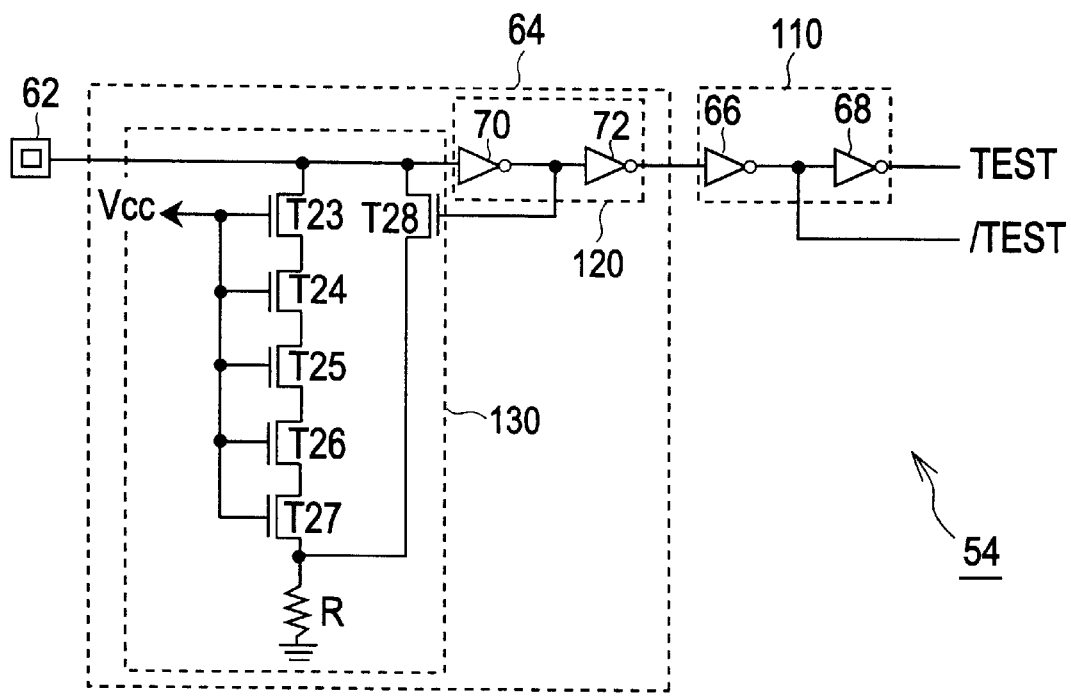
FIG. 2 is a schematic diagram of the principal parts of a first embodiment of a semiconductor storage device of this invention.

FIG. 2 is a figure provided to explain the signal outputs of test signal lines (TEST and /TEST (explained below)), as the first and second signal lines in FIG. 1, and shows in summary an example of one configuration of a first test signal generation unit, which is combined with the control signal switching unit of FIG. 1 as another principal part of a preferred control circuit.

The control circuit of this embodiment comprises a first test signal generation unit 54, and a control signal switching unit 56, and a first pad portion 62 as shown in FIG. 2. The first test signal generation unit 54 is a signal generation unit which generates first and second signals as driving signals for output as output voltages from test signal lines (TEST and /TEST). The control signal switching unit 56 performs switching of control signals (described below) as shown in FIG. 1, based on the output voltage from the first test signal generation unit 54, that is, the driving voltage. This control signal switching unit 56 is inserted between the NOT gates 26 and 32, and the NOT gates 28 and 34.

As control signals from the control signal switching unit 56, a first control signal is output from the first control signal output terminal 58, and a second control signal is output from the second control signal output terminal 60.

In this first embodiment, the first test signal generation unit 54 comprises a first two-stage series-connected circuit 110 of NOT gates, as shown in FIG. 2. A signal voltage formed based on a first applied voltage, applied from outside the control circuit, is supplied to this first two-stage series-connected circuit. The first applied voltage from outside the control circuit is applied to a first pad portion 62. The first test signal generation unit 54 comprises a first circuit 64, which outputs a voltage based on the first applied voltage input to the first pad portion 62; a 10th NOT gate 66, to which is input as a signal voltage the output voltage from this first circuit 64; and an 11th NOT gate 68, to which, after the output voltage passes through the 10th NOT gate 66 and is branched into two, one output is input. The series-connected circuit of the 10th NOT gate 66 and the 11th NOT gate 68 constitutes the first two-stage series-connected circuit 110.

The output signal of the 11th NOT gate 68 is a test signal TEST used as a driving signal; the output signal of the 10th NOT gate 66 is a test signal /TEST used as a driving signal.

As shown in FIG. 2, the first circuit 64 comprises 23rd through 28th transistors (T23, T24, T25, T26, T27 and T28), and 12th and 13th NOT gates 70 and 72. The NOT gates 70 and 72 constitute a second two-stage series-connected circuit 120, which is connected in series between the first pad portion 62 and the 10th NOT gate 66, in this order. The 23rd through 27th transistors (T23, T24, T25, T26, T27) constitute a first transistor series-connected circuit. In this first transistor series-connected circuit, the channels of each of the transistors are connected in series in this order, with one end connected to the point of connection between the first pad portion 62 and the 12th NOT gate 70, and the other end connected to ground, and with the gate electrodes of these transistors commonly connected to Vcc. The 28th transistor T28 is connected with channel between the above-mentioned connection point and ground, and the gate electrode of the transistor T28 is connected to the connection point between the 12th and the 13th NOT gates 70 and 72. A resistance R is provided between these transistors T27 and T28, and ground. In this embodiment, the first pad portion 62 is a specialized pad provided to apply the first applied voltage.

The first circuit 64 is, as shown in FIG. 2, a circuit configured such that when the first applied voltage applied to the first pad portion 62 is at GND (low) level, or when no voltage is applied, the output voltage from the first circuit 64 is in the "H" state (for example, a pulldown circuit).

As shown in FIG. 1, the control signal switching unit 56 comprises a NOR gate (inverted OR circuit) 74 and first through fourth transmission gates (TM1, TM2, TM3, TM4). The memory cell select signal lines BSl and BSr are connected to the two input terminals of the NOR gate 74.

The transmission gates (TM1, TM2, TM3, TM4) are a P-MOST (P-MOS transistor) and N-MOST (N-MOS transistor) connected in parallel, with the source electrode of one and drain electrode of the other as the input gate, and the other source and drain as the output gate. By applying a voltage supplied from two directions (from the P-MOST gate and from the N-MOST gate) to each transmission gate, the data (voltage) from the input to each transmission gate is transmitted to the output side.

In this example of the configuration of a control signal switching unit 56, the first signal, that is, the test signal line TEST, is connected as a driving signal to the gate electrodes on the P-MOST sides of the first and fourth transmission gates TM1 and TM4, and is connected to the gate electrodes on the N-MOST sides of the second and third transmission gates TM2 and TM3. On the other hand, the second signal, that is, the test signal line /TEST, is connected as a driving signal to the gate electrodes on the N-MOST sides of the first and fourth transmission gates TM1 and TM4, and is connected to the gate electrodes on the P-MOST sides of the second and third transmission gates TM2 and TM3.

In addition, this control signal switching unit 56 comprises first and second input terminals, to which are supplied the inverted signals of first and second selection signals to select a plurality of memory cell arrays, for example first and second memory cell arrays; a third input terminal, to which the inverted-OR signal of these first and second selection signals is supplied; and first and second output terminals, each of which output control signals, for example first and second control signals.

Further, the channel of TM1 is provided between the output side (first input terminal) of the first NOT gate 26 and the input side (that is, the first output terminal) of the second NOT gate 28. The channel of TM2 is provided between the output side (third input terminal) of the NOR gate (inverted-OR circuit) 74 and the input side (first output terminal) of the second NOT gate 28. The channel of TM3 is provided between the output side (third input terminal) of the NOR gate 74 and the input side (second output terminal) of the fifth NOT gate 34. The channel of TM4 is provided between the output side (second input terminal) of the fourth NOT gate 32 and the input side (second output terminal) of the fifth NOT gate 34.

The output voltage from the above-described test signal line TEST is used as the voltage supplied to each gate electrode of the transmission gates TM1 and TM4 from the P-MOST side, and the output voltage from /TEST is used as the voltage supplied to each gate electrode of the transmission gates TM1 and TM4 from the N-MOST side.

The output voltage from the test signal line TEST is used as the voltage supplied to each of the gate electrodes of the transmission gates TM2 and TM3 from the N-MOST side, and the output voltage from /TEST is used as the voltage supplied to each of the gate electrodes of the transmission gates TM2 and TM3 from the P-MOST side.

The data (voltage) input to the transmission gate TM1 is taken to be the data (voltage) output from the memory cell select signal line BSl, via the NOT gate 26.

The data (voltage) input to the transmission gate TM4 is taken to be the data (voltage) output from the memory cell select signal line BSr, via the NOT gate 32.

The data (voltage) input to the transmission gates TM2 and TM3 is taken to be the data (voltage) output from the memory cell select signal lines (BSl and BSr), via the NOR gate 74.

The data (voltage) transmitted via the transmission gates TM1 and TM2 is input to the input terminal of the NOT gate 28 and to one of the input terminals of the NAND gate 38.

The data (voltage) transmitted via the transmission gates TM3 and TM4 is input to the input terminal of the NOT gate 34 and to the other input terminal of the NAND gate 38.

Next, the operation of a semiconductor storage device with the above-described configuration is explained.

The switching means comprised by the semiconductor storage device of this invention performs switching operations between conducting and non-conducting states, according to control signals issued based on a first applied voltage which is applied to the control circuit from outside. The details are explained below.

First, in performing data reading during normal operation, it is assumed that the first applied voltage level applied to the first pad portion 62 in FIG. 2 is the unapplied state or the "L" (GND) state.

Due to the "L" level output voltage from the first circuit 64, the test signal line TEST assumes the "L" state signal level via the NOT gates 66 and 68, and the test signal line /TEST assumes the "H" state signal level via the NOT gate 66.

Hence with the output voltage from these test signal lines (TEST and /TEST) input to the control signal switching unit 56 of FIG. 1, data readout operations are performed similarly to the case of the prior art explained above.

That is, at time t0 (the initial state) (when the signal levels output by the memory cell select signal lines (BSl and BSr) are both in the "L" state), of the transmission gates, the first and the fourth transmission gates TM1 and TM4 are in the on state, and the second and third transmission gates TM2 and TM3 are in the off state.

Hence the signal levels (the first control signal and second control signal) from the first control signal output terminal 58 and the second control signal output terminal 60, output from the control signal switching unit 56, are both in the "H" state.

Similarly until reaching time t1 (when only the signal level of the memory cell select signal line BSl of the selected memory cell array MCBLKl has changed from the "L" to the "H" state), of the transmission gates, the first and fourth transmission gates TM1 and TM4 are in the on state, and the second and third transmission gates TM2 and TM3 are in the off state.

Hence the first control signal level at the first control signal output terminal 58, output from the control signal switching unit 56, is in the "L" state, and the second control signal level from the second control signal output terminal 60 is in the "H" state.

Therefore, in data readout during normal operation, the gate electrodes of transistors used as switching means (T3 and T4) provided in the DRAM explained with reference to FIG. 7 are in the off state, and the section between the unselected memory cell array MCBLKr and the sense amp 10 is in the non-conducting state, based on these first and second control signal levels. Thereafter, data readout is performed similarly to the previously explained case of the prior art, and so a detailed explanation is omitted.

Figure 8:
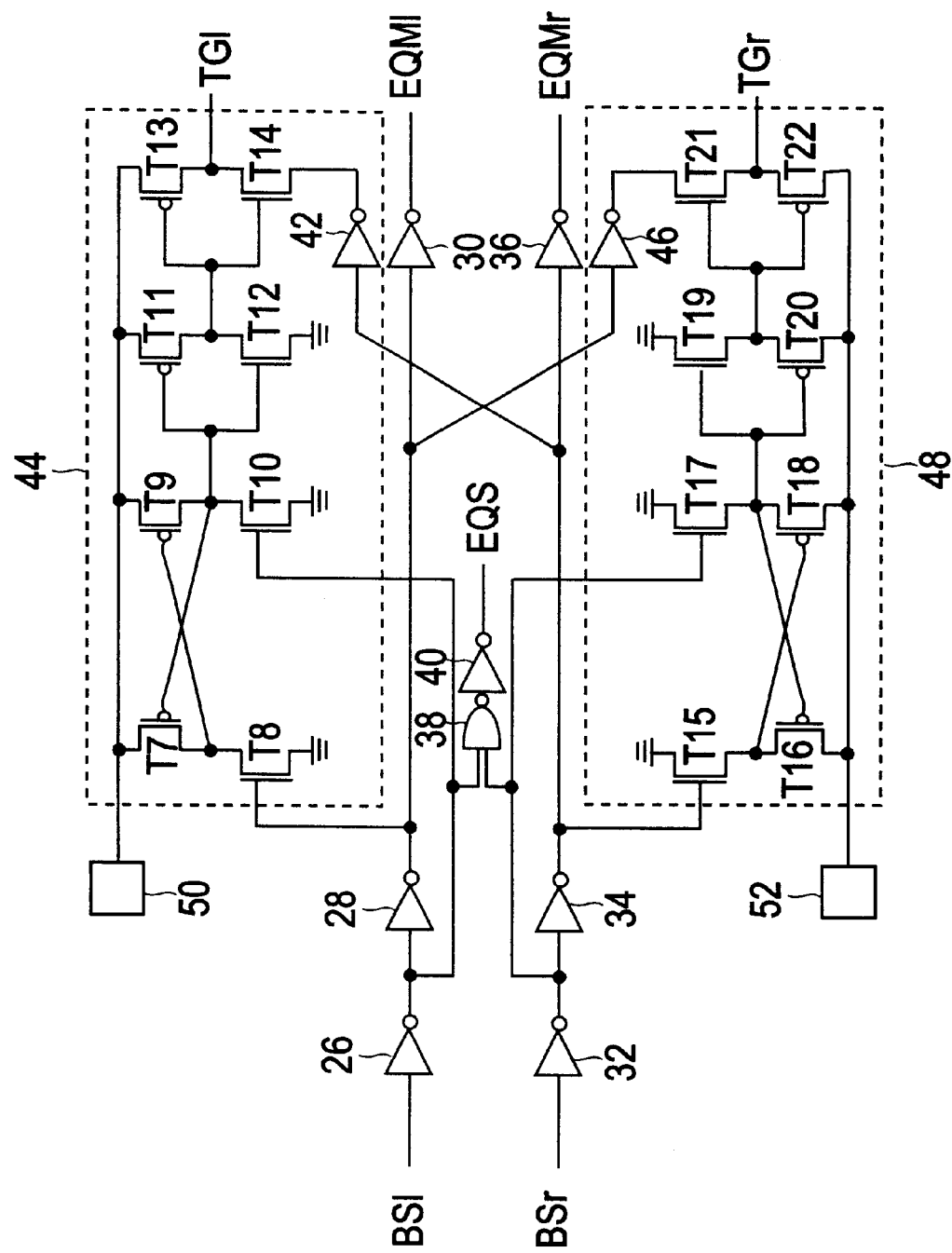
FIG. 8 is a schematic diagram of the principal parts of a semiconductor storage device of the prior art; and, FIG. 9 is a figure used in explaining the operation of a semiconductor storage device of the prior art.

That is, the configuration accompanying the control signal switching unit 56 shown in FIG. 1 is, in operations to read data during normal operation of the DRAM shown in FIG. 7, similar to the functions effected by the configuration of FIG. 8, and so operation waveform patterns during this normal operation are similar to the conventional operation waveform patterns shown in FIG. 9.

Next, data readout operations during probe tests or other electrical characteristic tests (hereafter called "characteristic tests") are explained.

Figure 3:
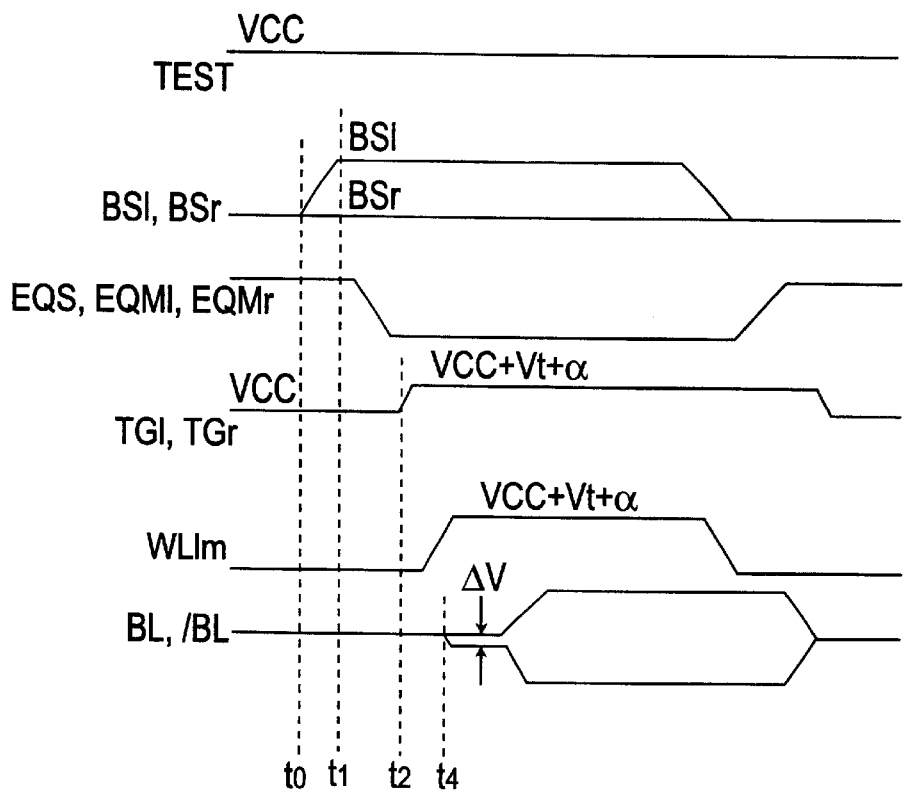
FIG. 3 is a figure used in explaining the operation of a semiconductor storage device of this invention.

FIG. 3 is an operation waveform diagram used to explain these characteristic tests; it is an operation waveform diagram for the operation of readout of zero (0) from a memory cell during characteristic tests (probing tests or similar), and the times t0 to t2 and t4 in the figure correspond to the same times in FIG. 9.

In performing the operation to read data during characteristic tests, it is assumed that the first applied voltage level applied to the first pad portion 62 in FIG. 2 is the "H" (Vcc) state.

Together with this, the test signal line TEST assumes the signal level in the "H" state via the NOT gates 66 and 68, and the test signal line /TEST assumes the signal level in the "L" state via the NOT gate 66, due to the "H" level output voltage from the first circuit 64.

Because, with the output voltages from these test signal lines (TEST and /TEST) input to the control signal switching unit 56 of FIG. 1, data readout operations are performed similarly to the case of the prior art explained above, a detailed explanation is omitted.

That is, at time t0 (the initial state—in other words, when the signal levels output by the memory cell select signal lines (BSl and BSr) are both in the "L" state), the transmission gates (TM1, TM2, TM3, TM4) are in the following states: the transmission gates TM2 and TM3 are in the on state, and the transmission gates TM1 and TM4 are in the off state.

Hence the levels of the first control signal from the first control signal output terminal 58 and of the second control signal from the second control signal output terminal 60, output by the control signal switching unit 56, are both in the "H" state.

Even when time t1 (when only the signal level of the memory cell select signal line BSl of the selected memory cell array MCBLKl changes from the "L" to the "H1" state) is reached, the transmission gates (TM1, TM2, TM3, TM4) are in the following states: the transmission gates TM2 and TM3 are in the on state, and the transmission gates TM1 and TM4 are in the off state.

Hence the levels of the first control signal from the first control signal output terminal 58 and of the second control signal from the second control signal output terminal 60, output by the control signal switching unit 56, both enter the "L" state.

As a result, the levels of the equalizer signals from the equalizer lines (EQMl, EQMr and EQS) change from the "H" to the "L" state.

Hence the equalizers of the bit lines BL and /BL of the memory cell arrays (MCBLKl and MCBLKr) are both cut off, and both bit lines enter a floating state, while being held at the potential (½)Vcc.

Next, at time t2 the output voltages from the transfer gate control lines TGl and TGr, provided between the sense amp 10 on one side and the selected memory cell array MCBLKl and unselected memory cell array MCBLKr on the other, both become Vcc+Vt+α (where Vt is a threshold value, and α>0).

Hence in this embodiment, the gates of the transistors used as switching means (T1, T2, T3, T4) enter the on state, and the sections between the selected and unselected memory cell arrays (MCBLKl and MCBLKr) and the sense amp 10 both enter the conducting state, based on the first and second control signals levels.

Next, similarly to the case of the prior art previously described, after passing through word line voltage increase, sense amp sensitivity amplification, and other processes, the bit line information is read on the data bus.

As explained above, in this embodiment the switching means provided in the semiconductor storage device appropriately switches between a non-conducting state during normal operation and a conducting state during characteristic tests, based on control signals output according to the level of a first applied voltage applied to the control circuit.

Hence in characteristic tests, by putting the section between the unselected memory cell array MCBLKr and the sense amp 10 into a conducting state, a configuration can be created in which the wiring capacitance Cb of the bit lines (BL and /BL) per memory cell of the unselected memory cell array MCBLKr cannot be neglected.

As a result, the wiring capacitance Cb during the characteristic test can be made approximately twice its value during normal operations, and from the above equation (2), the change in potential ΔV of the bit lines can be made approximately half that of the prior art.

In a configuration which reduces the potential change ΔV, as explained above, the sense amp sensitivity may be inadequate; or, even for a potential change ΔV that can be sensed by the sense amp, there is a greater possibility that normal amplification action may not occur, or that, in defective memory cells in which there are insufficient electrons to constitute the prescribed data ("1" or "0") of the memory cell, the amplification operation may occur in a state in which the sign of the potential change ΔV has been inverted.

However, by employing reduction of the potential change ΔV, which is undesired during normal operation, while performing characteristic tests, the configuration is such that malfunctions of the sense amp occur easily, and execution of screening becomes easier. Hence simple screening is more practical than in the prior art.

Second Embodiment

Figure 4:
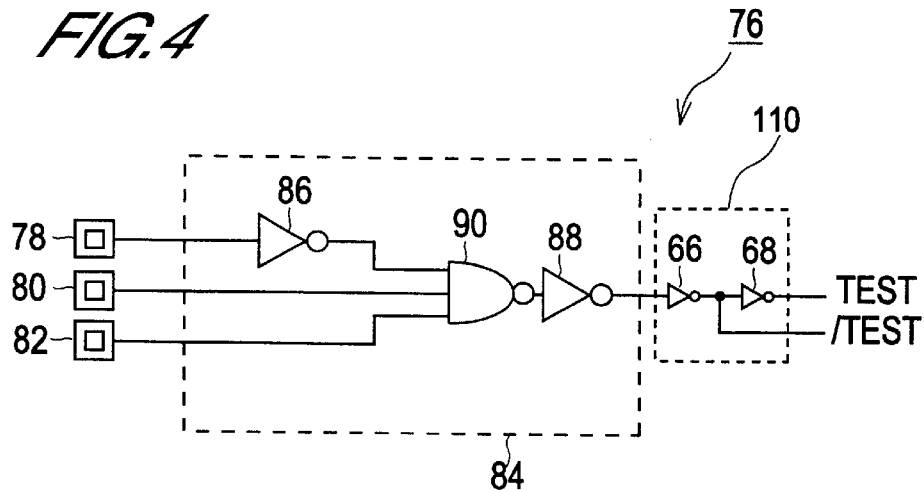
FIG. 4 is a schematic diagram of a second embodiment of a semiconductor storage device of this invention.

FIG. 4 is a figure used to explain a second embodiment, and shows in summary an example of one configuration of a second test signal generation unit to replace the above-described first test signal generation unit. In this embodiment, differences with the first embodiment are explained; explanations of component parts and operations which are the same as in the first embodiment are omitted insofar as possible.

In the second embodiment, the control circuit comprises a selector unit which outputs a first applied voltage based on a plurality of second applied voltages, applied to the control circuit from outside, and a plurality of second pad portions.

As shown in FIG. 4, the control circuit of this embodiment comprises a second test signal generation unit 76 which generates test signals TEST and /TEST, and the control signal switching unit 56 shown in FIG. 1, which performs switching of control signals based on the output voltage from the second test signal generation unit 76.

Similarly to the first embodiment, a first control signal from the first control signal output terminal 58, and a second control signal from the second control signal output terminal 60, are output as control signals from the control signal switching unit 56.

As shown in FIG. 4, in the second embodiment, the second test signal generation unit 76 is connected to a plurality of second pad portions (78, 80 and 82) in order to individually apply a plurality of second applied voltages to the control circuit from outside. The second test signal generation unit 76 comprises a second circuit 84 as a selector unit which outputs an output voltage (equivalent to the first applied voltage of the first embodiment) based on application of a second applied voltage to these second pad portions (78, 80, 82); a 10th NOT gate 66 to which is input the output voltage from this second circuit 84; and an 11th NOT gate 68 to which is input one of the output voltages resulting from branching into two after passing through the NOT gate 66. The output of the 11th NOT gate 68 is the test signal TEST; the output of the 10th NOT gate 66 is the test signal /TEST.

As shown in FIG. 4, the second circuit 84 is a circuit which acts as a selection unit to output one output voltage based on the combination of the plurality of second applied voltages input to the second pad portions (78, 80, 82), and comprises 14th and 15th NOT gates 86 and 88, and a three-input NAND gate 90.

The input terminal of the 14th NOT gate 86 is connected to the second pad portion 78, and the output terminal is connected to one of the input terminals of the NAND gate 90. The input terminal of the 15th NOT gate 88 is connected to the output terminal of the NAND gate 90, and the output terminal is connected to the input terminal of the 10th NOT gate 66. The remaining two input terminals of the second NAND gate 90 are connected to the second pad portions 80 and 82.

Similarly to the first embodiment, when performing data readout during normal operation in this embodiment, of the combinations of "L" (GND) and "H" (Vcc) of second applied voltage levels applied to the plurality of second pad portions (78, 80, 82) in FIG. 4, the voltage applied to the second pad portions 78 and 80 is taken to be "L" (GND) level, and the voltage applied to the second pad portion 82 is taken to be "H" (Vcc) level.

Consequently, as a result of the "L" level output voltage from the second circuit 84, the test signal line TEST goes to the "L" state signal level via the NOT gates 66 and 68, and the test signal line /TEST goes to the "H" state signal level via the NOT gate 66.

Hence as in the first embodiment, with the output voltages from these test signal lines (TEST and /TEST) input to the control signal switching unit 56 of FIG. 1, data readout is performed similarly to the case of the prior art already described, and so a detailed explanation is omitted.

Next, in order to perform data readout during characteristic tests, it is assumed that the voltage applied to the second pad portion 78 shown in FIG. 4 is at "L" (GND) level, and that the voltage applied to the second pad portions (80 and 82) are at "H" (Vcc) level.

Consequently, as a result of the "H" level output voltage from the second circuit 84, the test signal line TEST is at the "H" state signal level via the NOT gates 66 and 68, and the test signal line /TEST is at the "L" state signal level via the NOT gate 66.

Hence as in the first embodiment, with the output voltages of these test signal lines (TEST and /TEST) input to the control signal switching unit 56 of FIG. 1, data readout is performed similarly to the case of the prior art already explained.

In this way, an advantageous result similar to that of the first embodiment is obtained in this embodiment also.

Further, the second pad portions (78, 80, 82) of this embodiment are different from the first pad portion 62 newly provided in the first embodiment, in that these can be a plurality of pad (electrode) portions provided in advance on the semiconductor wafer (existing pad portions deemed necessary for the product), so that screening test costs can be reduced.

In this embodiment, the combination of second applied voltages applied to the second pad portions (78, 80, 82) during characteristic tests are combinations which are forbidden during actual operation of the semiconductor storage device; however, the scope of this patent is not thereby limited, and any arbitrary preferred combination may be used.

Third Embodiment

Figure 5:
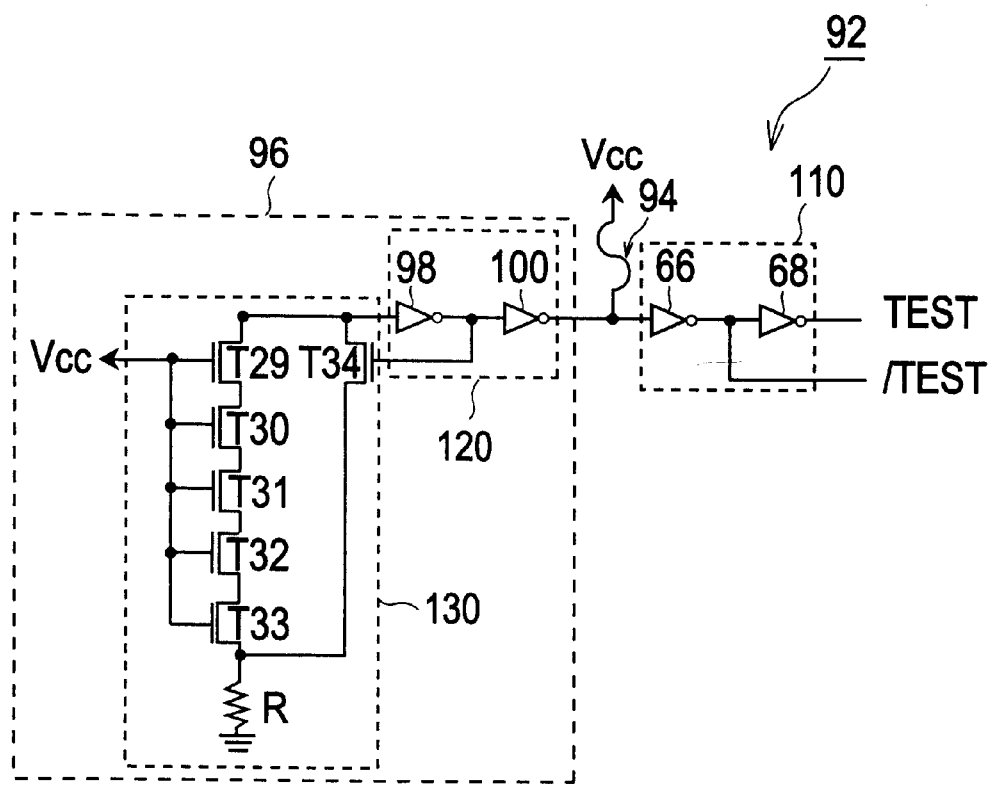
FIG. 5 is a schematic diagram of a third embodiment of a semiconductor storage device of this invention.

FIG. 5 is a figure used to explain the third embodiment, and shows in summary an example of one configuration of a third test signal generation unit to replace the above-described first and second test signal generation units. In this embodiment, differences with the first embodiment are explained; explanations of component parts and operations which are the same as in the first embodiment are omitted insofar as possible.

In the third embodiment, the first applied voltage has a first voltage with a high voltage value, and a second voltage with a voltage value lower than the first voltage; when application of the first voltage is cut off, the control circuit performs switching between conducting and non-conducting states of the switching means based on the second voltage.

That is, the control circuit of this embodiment comprises a third test signal generation unit 92, shown in FIG. 5, which generates test signals TEST and /TEST as driving signals, and a control signal switching unit 56 with the configuration shown in FIG. 1, which performs switching of control signals based on the output voltages, as driving signals, from the third test signal generation unit 92.

Similarly to the first embodiment, a first control signal from the first control signal output terminal 58, and a second control signal from the second control signal output terminal 60, are output from the control signal switching unit 56 as control signals.

As shown in FIG. 5, in the third embodiment the third test signal generation unit 92 comprises a first two-stage series-connected circuit 110 of NOT gates. This first two-stage series-connected circuit 110 supplies a signal voltage which is formed based on the applied voltage applied from outside the control circuit. This third test signal generation unit 92 comprises a fuse unit 94 connected between the input terminal of the first two-stage series-connected circuit 110 and the power supply voltage-level (Vcc) terminal, and a third circuit 96 connected to the input terminal of the first two-stage series-connected circuit 110. Of the first applied voltages applied to the control circuit, this power supply voltage level is the "H" (Vcc) level voltage, which is the first voltage applied from outside. The third circuit 96 outputs a voltage at "L" (GND) level as the second voltage, with voltage value lower than the first voltage.

The first two-stage series-connected circuit 110 of NOT gates comprises a 10th NOT gate 66, to which is input as a signal voltage the output voltage from the fuse unit 94 or from the third circuit 96, and an 11th NOT gate 68, to which is input one of the output voltages resulting from branching in two via the NOT gate 66. The output signal of the 11th NOT gate 68 is the test signal TEST, used as a driving signal; the output signal from the 10th NOT gate 66 is the test signal /TEST, used as a driving signal.

The third circuit 96 has effectively the same configuration as the first circuit 64 of the above-described first embodiment, but differs in that the third circuit 96 is not connected to the first pad portion 62. As shown in FIG. 5, this third circuit 96 comprises 29th through 34th transistors (T29, T30, T31, T32, T33, and T34), and 16th and 17th NOT gates 98 and 100. The fuse unit 94 is connected between the 17th NOT gate 100 and the 10th NOT gate 66.

The NOT gates 98 and 100 constitute a second two-stage series-connected circuit 120 of NOT gates. These NOT gates 98 and 100 are connected in series in this order, and are connected to the input of the 10th NOT gate 66.

The 29th through 33rd transistors (T29, T30, T31, T32, T33) constitute a first transistor series-connected circuit. One end of this first transistor series-connected circuit is connected to the first two-stage series-connected circuit 110 via the second two-stage series-connected circuit 120. This first transistor series-connected circuit is connected between the input terminal of the 16th NOT gate 98 and ground, with the channels series-connected in this order, and with the gates commonly connected to Vcc. The 34th transistor T34 is connected with channel between the input terminal of the above-mentioned 16th NOT gate 98 and ground; the gate electrodes of this transistor T34 is connected to the point of connection between the 16th and 17th NOT gates 98 and 100. A resistance R is inserted between the transistors T33 and T34, and ground.

As shown in FIG. 5, the third circuit 96 does not comprise a pad portion or other portion for application of a voltage; that is, the circuit is configured such that an "L" (GND) state first applied voltage is output in a state in which no voltage is applied.

Similarly to the first embodiment, when performing data readout during characteristic tests, the first applied voltage in this embodiment is taken to be the "H" (Vcc) level output from the fuse unit 94 in FIG. 5.

Consequently, the "H" level output voltage from the third circuit 96 causes the test signal line TEST to go to the "H" state signal level via the NOT gates 66 and 68, and causes the test signal line /TEST to go to the "L" state signal level via the NOT gate 66.

Hence similarly to the first embodiment, with the output voltages from these test signal lines (TEST and /TEST) input to the control signal switching unit 56 of FIG. 1, the data readout operation is performed similarly to the case of the prior art as previously described, and so a detailed explanation is omitted.

In this embodiment, after completion of the characteristic test, when performing data readout in normal operation, fuse cutoff processing is performed to cut off the first voltage output via the fuse unit 94, and the first applied voltage is switched to the second voltage at the "L" (GND) level, with a voltage value lower than the first voltage.

With this, the test signal line TEST goes to the "L" state signal level via the NOT gates 66 and 68, and the test signal line /TEST goes to the "H" state signal level via the NOT gate 66, due to the "L" level output voltage from the third circuit 96.

Hence similarly to the first embodiment, with the output voltages from these test signal lines (TEST and /TEST) input to the control signal switching unit 56 of FIG. 1, data readout similar to the case of the prior art previously explained is performed.

Thus in this embodiment also, an advantageous result similar to that of the first embodiment can be obtained.

Further, in this embodiment the first and second voltages applied to the control circuit as a first applied voltage can be switched by means of fuse cutoff processing, so that switching from characteristic tests to normal operation can be performed easily.

Fourth Embodiment

Figure 6:
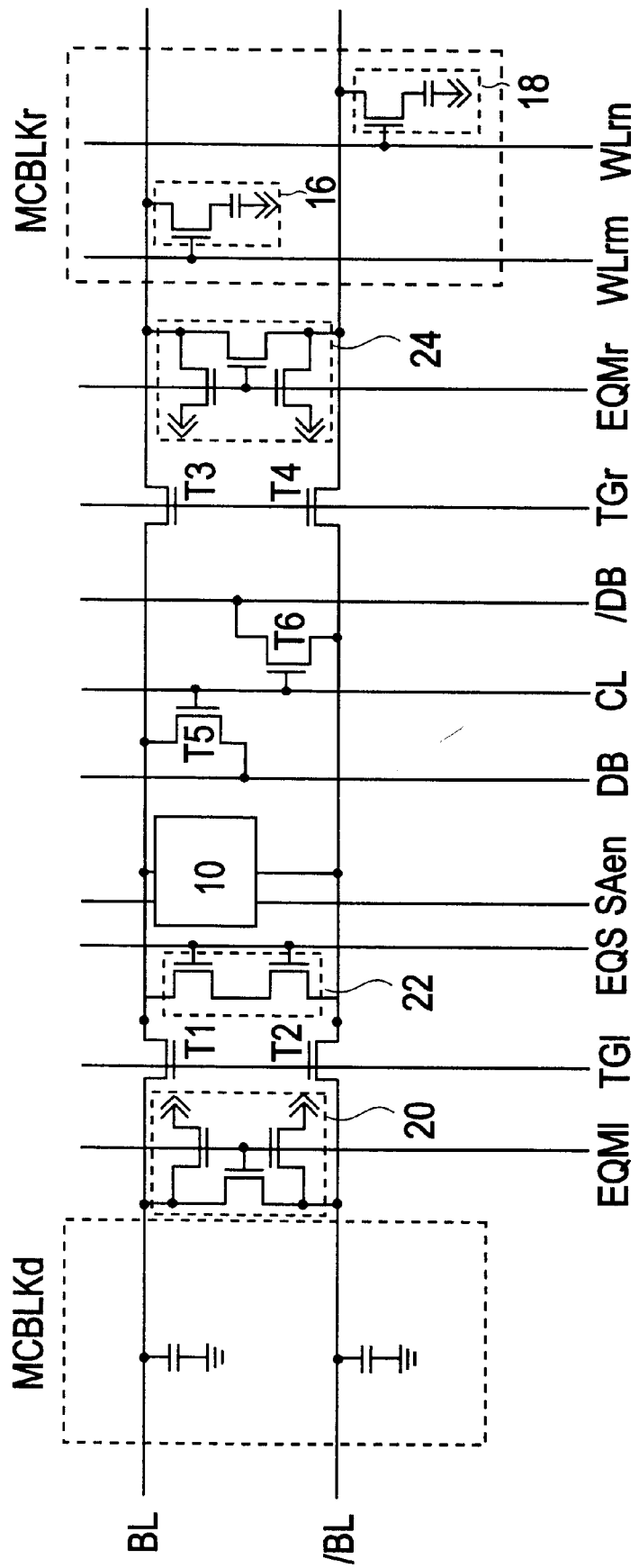
FIG. 6 is a schematic diagram of a fourth embodiment of a semiconductor storage device of this invention.

FIG. 6 is a figure provided to explain a fourth embodiment, and shows in summary an example of the configuration of the principal parts of a semiconductor storage device to replace the semiconductor storage device in the above-mentioned FIG. 7.

In this embodiment, differences in the semiconductor storage device of FIG. 6 with that of FIG. 7 are explained; explanations of component parts and operations which are the same as in FIG. 7 are omitted insofar as possible.

In the configuration of this embodiment, one of the memory cells arrays (MCBLKl or MCBLKr) of the semiconductor storage device explained in FIG. 7 is taken to be a dummy (virtual) memory cell.

That is, as shown in FIG. 6, the DRAM in this embodiment comprises one memory cell array MCBLKr, one dummy (virtual) memory cell array MCBLKd, and one sense amp 10.

The memory cell array MCBLKr, virtual memory cell arrays MCBLKd, and sense amp 10 are connected by a bit line pair, comprising the bit line BL as a first bit line and the bit line /BL as a second bit line.

In the DRAM memory cell array MCBLKr, these bit lines BL and /BL intersect with word lines, and memory cells are connected to each of these points of intersection.

In FIG. 6, two word lines (WLrm and WLrn), and two memory cells, the third and fourth (16, 18), are shown.

Between the sense amp 10 and the virtual memory cell array MCBLKd are provided, as part of the bit lines BL and /BL, first and second transistors T1 and T2. In other words, the main current path between source electrode and drain electrode, that is, the channel, of the transistor T1 is provided in the bit line BL. The main current path between source electrode and drain electrode, that is, the channel, of the transistor T2 is provided in the bit line /BL. The transfer gate control line TGl is connected to the gate electrodes of these transistors (T1 and T2).

Transistors T3 and T4 are provided between the sense amp 10 and the memory cell array MCBLKr. In other words, the main current path between source electrode and drain electrode, that is, the channel, of the transistor T3 is provided in the bit line BL. Also, the main current path between source electrode and drain electrode, that is, the channel, of the transistor T4 is provided in the bit line /BL. The transfer gate control line TGr is connected to the gate electrodes of these transistors (T3 and T4).

In this embodiment, the gates of the first and second transistors T1 and T2 are gates used as switching means.

Similarly to the cases of each of the above-mentioned embodiments, the semiconductor storage device of the embodiment shown in FIG. 6 comprises the control signal switching unit 56 shown in FIG. 1, and also comprises one among the first test signal generation unit 54, second test signal generation unit 76, or third test signal generation unit 92, which generates signals for the test signal lines (TEST and /TEST) which are the first and second signal lines shown in FIG. 1.

Similarly to the cases of each of the above-described embodiments, data readout is performed with the output voltages from these test signal lines (TEST and /TEST) input to the control signal switching unit 56 shown in FIG. 1.

However, in this embodiment the selected word line is WLrm.

Hence in data readout during normal operation, the gate electrodes of the transistors (T1 and T2) provided as switching means in the DRAM explained with reference to FIG. 6 are in the off state, and the [section] between the dummy (virtual) memory cell array (MCBLKd) and the sense amp 10 is in the non-conducting state, based on the first and second control signal levels.

In data readout during characteristic tests, the gate electrodes of the transistors (T1 and T2) used as switching means are in the on state, and the section between the selected and dummy (virtual) memory cell arrays (MCBLKr and MCBLKd) and the sense amp 10 is in the conducting state, based on the first and second control signal levels.

Thus in this embodiment, by providing a dummy (virtual) memory cell array MCBLKd, the section between the dummy (virtual) memory cell array MCBLKd and the sense amp 10 can be put into the conducting state during characteristic tests even when, in the device configuration, only a single memory cell is connected to one sense amp. Hence a configuration can be obtained in which the wiring capacitance Cb of the bit lines BL and /BL per memory cell of the dummy (virtual) memory cell array MCBLKd can be made non-negligible.

As a result, in this embodiment also, an advantageous result similar to that of the first embodiment can be obtained.

Also, by means of this configuration, screening of all the memory cells in the semiconductor storage device is possible, and so the screening accuracy can be further improved.

In the above, embodiments of this invention have been explained referring to the drawings; but this invention is not limited to the particulars indicated in the above-described embodiments. Hence this invention includes the scope of claims and the detailed description of the invention, as well as the scope within which a practitioner can perform modifications and applications, based on well-known technology.

Moreover, the circuit configurations of the test signal generation unit and control signal switching unit are not limited to the above-described examples, but other arbitrary preferred configurations may be used.

What is claimed is:

1. A semiconductor storage device, comprising:
   a plurality of memory cells;
   a bit line pair, consisting of a first and a second bit line, connected to said memory cells;
   a control circuit, which outputs control signals to put the sections of said first and second bit lines between the sense amp and the memory cells connected to the sense amp into a non-conducting state during normal operation, and to put said sections of the first and second bit lines into a conducting state during characteristic tests; and
   a sense amp, connected to said bit line pair, wherein said first and second bit lines are each provided with a switch, connected to the section between said sense amp and the memory cells, and said switch performs operations to switch between said conducting state and said non-conducting state, in response to said control signal, generated from said control circuit based on a first applied voltage applied to said control circuit from outside; and wherein said first applied voltage comprises a first voltage, and a second voltage with a voltage value lower than the first voltage, and in cases where application of said first voltage is cut off, said control circuit switches between said conducting state and said non-conducting state of said switch, based on said second voltage.

2. A semiconductor storage device, comprising:
   a plurality of memory cells;
   a bit line pair, consisting of a first and a second bit line, connected to said memory cells;
   a sense amp, connected to said bit line pair;
   a control circuit, which outputs control signals to put the sections of said first and second bit lines between the sense amp and the memory cells connected to the sense amp into a non-conducting state during normal operation, and to put said sections of the first and second bit lines into a conducting state during characteristic tests wherein said first and second bit lines are each provided with a switch, connected to the section between said sense amp and the memory cells, and said switch performs operations to switch between said conducting state and said non-conducting state, in response to aid control signal, generated from said control circuit based on a first applied voltage circuit comprises a signal generation unit which generates a first and a second to said control circuit from outside; and wherein
   signal based on said first applied voltage, and a control signal switching unit which performs switching of said control signals based on said first and second signals; and
   said control signal switching unit comprises a plurality of transmission gates by means of which the voltages of said first and second signals are supplied from two directions, and outputs said control signals based on the combination of the conducting state and non-conducting state of the transmission gates.

3. A semiconductor storage device, comprising:

a plurality of memory cells;

a bit line pair, consisting of a first and a second bit line, connected to the memory cells;

a sense amp connected to the bit line pair a switch, provided in said first and second bit lines, in the section between the sense amp and the memory cells connected to the sense amp; and a control circuit which performs switching control of said switch;

wherein said control circuit comprises a control signal switching unit which outputs control signals for said switching control, and a signal generation unit which outputs driving signals for driving said control signal switching unit; wherein said signal generation unit comprises a first two-stage series-connected circuit of NOT gates, to which is supplied a signal voltage formed based on a first applied voltage applied to said control circuit from outside, and outputs as said driving signals the first and second signals according to said signal voltages from the first-stage and second-stage NOT gates; and wherein said signal generation unit is connected to a first pad portion to which is applied said first applied voltage, and comprises a first circuit which is connected to the first pad portion, and outputs a signal voltage to said first two-stage series-connected circuit based on the first applied voltage; wherein said first circuit comprises a second two-stage series-connected circuit of NOT gates connected between said first pad portion and said first two-stage series-connected circuit; a series circuit, configured from a plurality of transistors the gate electrodes of which are coupled with the power supply voltage, and one end of which is connected to said first pad portion; one transistor, connected in series to both ends of the series circuit, the gate electrode of which is connected to the connection midpoint between the first and the second NOT gates of said second two-stage series-connected circuit; and, a resistance connected between one end of said series circuit and ground.

4. A semiconductor storage device, comprising:

a plurality of memory cells;

a bit line pair, consisting of a first and a second bit line, connected to the memory cells;

a sense amp connected to the bit line pair;

a switch, provided in said first and second bit lines, in the section between the sense amp and the memory cells connected to the sense amp; and a control circuit which performs switching control of said switch;

wherein said control circuit comprises a control signal switching unit which outputs control signals for said switching control, and a signal generation unit which outputs driving signals for driving said control signal switching unit; wherein said signal generation unit comprises a first two-stage series-connected circuit of NOT gates, to which is supplied a signal voltage formed based on a first applied voltage applied to said control circuit from outside, and outputs as said driving signals the first and second signals according to said signal voltages from the first-stage and second-stage NOT gates; and wherein said signal generation unit is connected to a first pad portion to which is applied said first applied voltage, and comprises a first circuit which is connected to the first pad portion, and outputs a signal voltage to said first two-stage series-connected circuit based on the first applied voltage; wherein said first circuit comprises a second two-stage series-connected circuit of NOT gates, the output terminal of which is connected to the input terminal of said first two-stage series-connected circuit; a series circuit, configured from a plurality of transistors the gate electrodes of which are coupled with the power supply voltage, and one end of which is connected to the input terminal of said second two-stage series-connected circuit; and one transistor, connected in series to both ends of the series circuit, the gate electrode of which is connected to the connection midpoint between the first and the second NOT gates of said second two-stage series-connected circuit; and, a resistance connected between one end of said series circuit and ground.

5. A semiconductor storage device, comprising:

a plurality of memory cells;

a bit fine pair, consisting of a first and a second bit line, connected to the memory cells;

a sense amp connected to the bit line pair;

a switch, provided in said first and second bit lines, in the section between the sense amp and the memory cells connected to the sense amp; and a control circuit which performs switching control of said switch;

wherein said control circuit comprises a control signal switching unit which outputs control signals for said switching control, and a signal generation unit which outputs which is supplied a signal voltage formed based on a first applied voltage applied to said control circuit from outside, and outputs as said driving signals the first and second signals according to said signal voltages from the first-stage and second-stage NOT gates; and wherein said signal generation unit is connected to a first pad portion to which is applied said first applied voltage, and comprises a first circuit which is connected to the first pad portion, and outputs a signal voltage to said first two-stage series-connected circuit based on the first applied voltage; wherein said first circuit comprises a second two-stage series-connected circuit of NOT gates connected between said first pad portion and said first two-stage series-connected circuit;

a series circuit, configured from a plurality of transistors the gate electrodes of which are coupled with the power supply voltage, and one end of which is connected to said first pad portion; one transistor, connected in series to both ends of the series circuit, the gate electrode of which is connected to the connection midpoint between the first and the second NOT gates of said second two-stage series-connected circuit;

a resistance connected between one end of said series circuit and ground; and a fuse unit, provided between the connection midpoint of the first and second two-stage series-connected circuits and said power supply voltage level terminal.

6. A semiconductor storage device, comprising:

a plurality of memory cells;

a bit line pair, consisting of first and second bit lines, connected to said memory cells;

a sense amp, connected to said bit line pair;

a switch, provided in said first and second bit lines, in the sections between said sense amp and the memory cells connected to the sense amp; and, a control circuit which controls switching of said switch, wherein said control circuit comprises a control signal switching unit which outputs control signals for said switching control, and a signal generation unit which outputs driving signals to drive the control signal switching unit; and, said signal generation unit comprises a selector unit which outputs a first applied voltage based on a plurality of second applied voltages applied from outside said control circuit, and a first two-stage series-connected circuit of NOT gates to which is supplied the first applied voltage, and outputs, as said driving signals, first and second signals according to said first applied voltages from the first and the second NOT gates, wherein said selector unit is connected to separate second pad portions, to which are applied individually said plurality of second applied voltages; and wherein said selector unit comprises a NOT gate the input terminal of which is connected to the first of the second pad portions; and a NAND gate the first input terminal of which is connected to the output terminal of the NOT gate, the second input terminal of which is connected to the second of the second pad portions, and the third input terminal of which is connected to the remaining second pad portion; and another NOT gate the input terminal of which is connected to the output terminal of the NAND gate and output terminal of which is connected to the input terminal of the first two-stage series-connected circuit of said NOT gates, wherein, when part of said plurality of memory cells and the remainder of the cells constitute first and second memory cell arrays respectively, said control signal switching unit comprises:

first and second input terminals, to which are supplied the inverted signals of first and second select signals, in order to select said first and second memory cell arrays, respectively;

a third input terminal, to which is supplied the inverted-OR signal of the first and second select signals;

first and second output terminals, which output said respective control signals;

a first transmission gate, connected between said first input terminal and first output terminal;

a second transmission gate, connected between said third input terminal and first output terminal;

a third transmission gate, connected between said third input terminal and second output terminal; and a fourth transmission gate, connected between said second input terminal and second output terminal, wherein said control signal switching unit controls the conducting state of said first, second, third and fourth transmission gates by means of said first and second signals obtained according to said first applied voltage, and said control signals are output to said first and second output terminals according to said first and second select signals.

7. A semiconductor storage device, comprising:

a plurality of memory cells;

a bit line pair, consisting of a first and a second bit line, connected to said memory cells;

a sense amp, connected to said bit line pair;

a control circuit, which outputs control signals to put the sections of said first and second bit lines between the sense amp and the memory cells connected to the sense amp into a non-conducting state during normal operation, and to put said sections of the first and second bit lines into a conducting state during characteristic tests wherein said first and second bit lines are each provided with a switch, connected to the section between said sense amp and the memory cells, and said switch performs operations to switch between said conducting state and said non-conducting state, in response to said control signal, generated from said control circuit based on a first applied voltage applied to said control circuit from outside; and wherein said first applied voltage comprises a first voltage, and a second voltage with a voltage value lower than the first voltage; and in cases where application of said first voltage is cut off, said control circuit switches between said conducting state and said non-conducting state of said switch, based on said second voltage, wherein, when part of said plurality of memory cells and the remainder of the cells constitute first and second memory cell arrays respectively, said control signal switching unit comprises:

first and second input terminals, to which are supplied the inverted signals of first and second select signals, in order to select said first and second memory cell arrays, respectively;

a third input terminal, to which is supplied the inverted-OR signal of the first and second select signals;

first and second output terminals, which output said respective control signals; a first transmission gate, connected between said first input terminal and first output terminal;

a second transmission gate, connected between said third input terminal and first output terminal;

a third transmission gate, connected between said third input terminal and second output terminal; and, a fourth transmission gate, connected between said second input terminal and second output terminal;

and wherein said control signal switching unit controls the conducting state of said first, second, third and fourth transmission gates by means of said first and second signals obtained according to said first applied voltage, and said control signals are output to said first and second output terminals according to said first and second select signals.

* * * * *